US011489489B2

(12) United States Patent
Linderman

(10) Patent No.: US 11,489,489 B2
(45) Date of Patent: Nov. 1, 2022

(54) DUAL-POSITION MOUNT FOR POWER ELECTRONIC DEVICES

(71) Applicant: Enphase Energy, Inc., Petaluma, CA (US)

(72) Inventor: Ryan Linderman, Oakland, CA (US)

(73) Assignee: Enphase Energy, Inc., Petaluma, CA (US)

( * ) Notice: Subject to any disclaimer, the term of this patent is extended or adjusted under 35 U.S.C. 154(b) by 23 days.

(21) Appl. No.: 17/201,962

(22) Filed: Mar. 15, 2021

(65) Prior Publication Data

US 2021/0203275 A1    Jul. 1, 2021

Related U.S. Application Data

(63) Continuation of application No. 15/417,824, filed on Jan. 27, 2017, now Pat. No. 10,951,162.

(60) Provisional application No. 62/287,554, filed on Jan. 27, 2016.

(51) Int. Cl.
| | |
|---|---|
| *H02S 40/32* | (2014.01) |
| *H01L 31/048* | (2014.01) |
| *H02S 40/00* | (2014.01) |
| *H02S 40/30* | (2014.01) |
| *H02J 3/38* | (2006.01) |
| *H02S 30/10* | (2014.01) |
| *H02S 40/42* | (2014.01) |

(52) U.S. Cl.
CPC ............ *H02S 40/32* (2014.12); *H01L 31/048* (2013.01); *H02J 3/38* (2013.01); *H02J 3/381* (2013.01); *H02S 30/10* (2014.12); *H02S 40/00* (2013.01); *H02S 40/30* (2014.12); *H02S 40/42* (2014.12); *H02J 2300/24* (2020.01); *Y02E 10/56* (2013.01)

(58) Field of Classification Search
CPC ............................................... H02S 40/30–345
See application file for complete search history.

(56) References Cited

U.S. PATENT DOCUMENTS

| | | |
|---|---|---|
| 9,480,185 B2 | 10/2016 | Linderman |
| 2013/0208423 A1 | 8/2013 | Dumstorff et al. |
| 2014/0166356 A1 | 6/2014 | Armoni et al. |
| 2014/0168927 A1 | 6/2014 | Gilchrist et al. |
| 2015/0144181 A1 | 5/2015 | Mulligan et al. |
| 2015/0163949 A1 | 6/2015 | Zhang et al. |

(Continued)

FOREIGN PATENT DOCUMENTS

| | | | |
|---|---|---|---|
| KR | 20150089341 A | 8/2015 | |
| WO | WO-2015175839 A1 * | 11/2015 | ........... B64G 1/1085 |

OTHER PUBLICATIONS

International Search Report and Written Opinion dated Apr. 20, 2017 for PCT Application No. PCT/US2017/015282.

*Primary Examiner* — Ryan S Cannon
(74) *Attorney, Agent, or Firm* — Moser Taboada

(57) ABSTRACT

An apparatus for mounting a power electronic device to a photovoltaic (PV) module. In one embodiment, the apparatus comprises a mounting bracket that mechanically couples the power electronic device to the backsheet of the PV module such that positioning of the power electronic device can be dynamically interchanged between a retracted position in which the power electronic device is pressed flat to the backsheet, and an extended position in which the power electronic device is coupled to the backsheet with an air gap between the power electronic device and the backsheet.

18 Claims, 11 Drawing Sheets

(56) References Cited

U.S. PATENT DOCUMENTS

2015/0311861 A1 10/2015 Jeon et al.
2016/0013642 A1 1/2016 Linderman

* cited by examiner

DUAL-POSITION MOUNT FOR POWER ELECTRONIC DEVICES

CROSS-REFERENCE TO RELATED APPLICATIONS

This application is a continuation of co-pending U.S. patent application Ser. No. 15/417,824 entitled "Dual-Position Mount for Power Electronic Devices" and filed Jan. 27, 2017, which claims priority to U.S. provisional patent application Ser. No. 62/287,554, entitled "Dual-Position Mount for Electronics Modules" and filed Jan. 27, 2016. Each of the aforementioned patent applications is herein incorporated in its entirety by reference.

BACKGROUND OF THE INVENTION

Field of the Invention

Embodiments of the present disclosure relate generally to mounting a power electronic device to a mounting surface, and, in particular, to a two-position mounting bracket for mounting a power electronic device to a mounting surface of a mounting structure.

Description of the Related Art

Photovoltaic (PV) modules convert energy from sunlight received into direct current (DC). In some solar power systems, the PV modules used may be coupled to power electronic devices, such as DC-DC converters or DC-AC inverters, in a distributed architecture; i.e., one power electronic device per PV module. In such systems, each power electronic device may be mounted to the rear face (i.e., backsheet surface or superstrate) of the corresponding PV module.

Power electronic devices mounted to the rear face of a PV module (i.e., on the side of the PV module facing away from the sun) require heat insulation to and from the elements in order to not damage energy harvest and reduce operating temperatures of the devices. This may be accomplished by maintaining an airgap between the power electronic devices and the PV module face; for example, the electronics may be mounted to the PV module face using mounting rails that retain the electronics at a fixed distance from the PV module face.

Although maintaining a suitable airgap between the power electronic devices and the PV module face is required for proper operation of the power electronic devices, shipment of such assemblies is physical volume dependent, and the number of assemblies shipped on a pallet or inside a container has a direct impact on cost.

Therefore, there is a need in the art for an apparatus for mounting a power electronic device to a mounting structure such that (i) an air gap is present between the electronic device and the mounting surface during operation of the electronic device, and (ii) the mounted electronic device/mounting structure have a minimized footprint during shipping.

SUMMARY OF THE INVENTION

Embodiments of the present invention generally relate to an apparatus for mechanically coupling a power electronic device to a mounting surface substantially as shown and/or described in connection with at least one of the figures, as set forth more completely in the claims.

Various advantages, aspects and novel features of the present disclosure, as well as details of an illustrated embodiment thereof, will be more fully understood from the following description and drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally relate to a two-position mounting bracket for mounting a power electronic device to a surface. The mounting system allows for a lower profile form factor, for example for use in shipping and handling, which can easily be snapped to a second extended position. The extended position allows for a larger air gap between the power electronic device and the mounting surface for increased convective cooling. The mounting system further allows easy disassembly for replacement of the power electronic device.

The mounting bracket utilizes a system of latching mechanisms to allow a power electronic device to be easily attached or removed (e.g., in the field using only simple finger tools) and provides two well-defined positions to hold the power electronic device relative to the mounting surface. The mounting bracket has features that lock the power electronic device in the extended position requiring a tool to return the power electronic device back to the low position in order to prevent accidental repositioning in use, although in some alternative embodiments the power electronic device can be moved back to the low position without the use of a tool.

The invention described herein can be applied to any power electronic device for mounting the device on the surface of a low profile product, such as power conversion electronics mounted to a thin photovoltaic (PV) module, power supply electronics for an LED lighting fixture, motor controller electronics mounted to the motor wall, and the like. The invention could also be applied to products that need to have two different configurations or positions of features such as vision or other sensors moving between two locations or extended mechanical positions to reconfigure an assembled system.

In some embodiments, such as the embodiments described below, the mounting bracket is a two-position mount for a power electronic device used with a thin profile PV module. The low or retracted position configuration of the mounted power electronic device keeps the power electronic device close to the PV module laminate surface where it is recessed below the PV module's outer frame profile. This allows the PV module with the mounted power electronic device to be stacked in shipping containers in a dense array without any additional volume required, comparable to a PV module without the mounted power electronic device.

Figure 1:
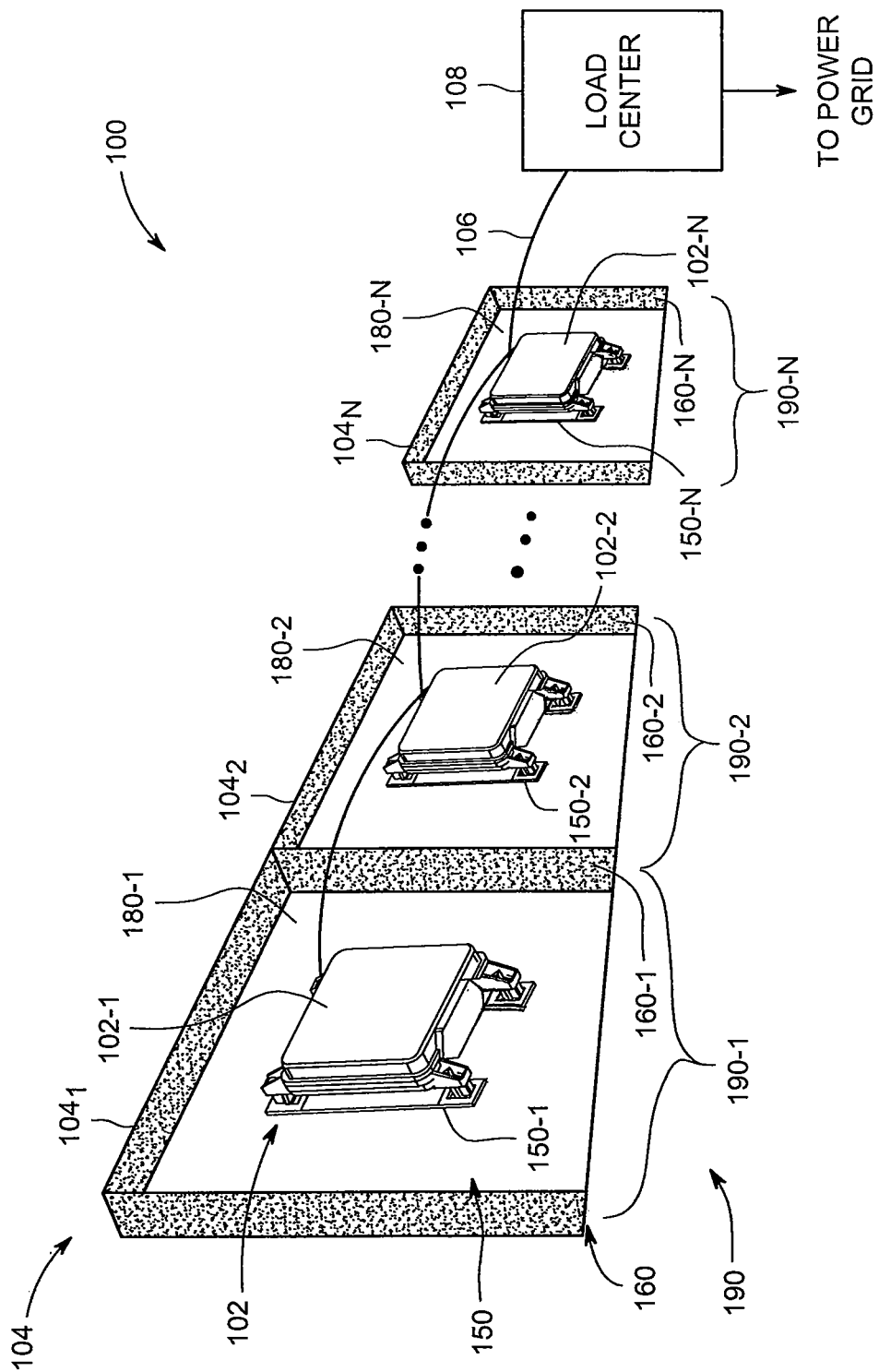
FIG. 1 is a block diagram depicting a physical layout of a photovoltaic (PV) system in accordance with one or more embodiments of the present invention.

FIG. 1 is a block diagram depicting a physical layout of a photovoltaic (PV) system 100 in accordance with one or more embodiments of the present invention.

The PV system 100 comprises a plurality of power electronic devices $102_1$, $102_2$ ... $102_n$ (collectively power electronic devices 102, or simply electronic devices 102), a plurality of PV modules $104_1$, $104_2$ ... $104_n$ (collectively PV modules 104), and a plurality of power electronic device mounting brackets $150_1$, $150_2$ ... $150_n$ (collectively power electronic device mounting brackets 150, or simply mounting brackets 150).

Each PV module $104_1$, $104_2$ ... $104_n$ comprises a structural frame $160_1$, $160_2$ ... $160_n$, respectively, collectively referred to as frames 160. Each of the frames 160 surrounds the perimeter of the corresponding PV module 104 and may be constructed of any rigid material, such as aluminum, rigid plastic, and the like, or any combination of such rigid materials. The frames 160 of the PV modules 104 are generally coupled flush with the frames 160 of neighboring PV modules 104 in a horizontal direction, although any suitable orientation and layout may be used.

Each electronic device $102_1$, $102_2$ ... $102_n$ is mechanically coupled to a corresponding PV module $104_1$, $104_2$ ... $104_n$ via a corresponding mounting bracket $150_1$, $150_2$ ... $150_n$, respectively, in a one-to-one correspondence. Each mounting bracket $150_1$, $150_2$ ... $150_n$ is adhered to the surface of a respective PV module backsheet $180_1$, $180_2$ ... $180_n$ (collectively referred to as backsheets 180)— i.e., the rear PV module face that is not exposed to sunlight—for retaining the corresponding electronic device $102_1$, $102_2$ ... $102_n$ proximate the PV module $104_1$, $104_2$ ... $104_n$. Each combined PV module 104/electronic device 102/mounting bracket 150 may be referred to as a power module assembly 190 (i.e., the combined PV module $104_1$, electronic device $102_1$, and mounting bracket $150_1$ form the power module assembly $190_1$, etc.). In one or more embodiments, the enclosure of the electronic device 102 is formed from an insulating material, for example a blend of polystyrene and polyphenylene ether (PPE) or a polycarbonate (PC) material, such that the electronic device 102 does not require any connection to a ground.

In accordance with one or more embodiments of the present invention, each of the mounting brackets 150 enables the corresponding electronic device 102 to be interchangeably maintained in one of two positions with respect to the corresponding PV module 102. In a first position, which also may be referred to as a retracted position, the mounting bracket 150 retains the corresponding electronic device 102 pressed flat to the respective PV module backsheet 180, for example during shipping. In a second position, which also may be referred to as an extended position, the mounting bracket 150 retains the corresponding electronic device 102 proximate the corresponding PV module backsheet 180 with a defined gap between the electronic device 102 and the PV module backsheet 180 that allows airflow between the components for thermal management of the electronic device 102 and the PV module 102. In some embodiments, the gap may be on the order of 10-25 mm and may depend on topology features of the electronic device enclosure; for example, in certain embodiments the gap may be on the order of 15 mm and other regions may be recessed by another 10 mm.

In addition to being mechanically mounted to the PV modules 104, the electronic devices $102_1$, $102_2$ ... $102_n$ are electrically coupled to the PV modules $104_1$, $104_2$ ... $104_n$ to receive the generated DC power from the corresponding PV module 104. Examples of such coupling may be found commonly assigned U.S. patent application Ser. No. 14/793,164, entitled "Photovoltaic Module with Integrated Power Electronics", filed Jul. 7, 2015, which is herein incorporated in its entirety by reference.

In some embodiments, the electronic devices 102 are DC-AC inverters for inverting DC power generated by the PV modules 104 to AC power. In such embodiments, the electronic devices 102 are coupled to a load center 108 via an AC bus 106 for distributing the AC output produced by the electronic devices 102. The load center 108 may house connections between an AC commercial power grid distribution system and the AC bus 106 for coupling the generated AC power to the grid. Additionally or alternatively, the generated AC power may be coupled to commercial and/or residential systems via the load center 108, as well as stored for later use (for example, the generated energy may be stored utilizing batteries, heated water, hydro pumping, $H_2O$-to-hydrogen conversion, or the like).

In other embodiments, the electronic devices 102 may be other types of electronic devices; for example, the electronic devices 102 may be DC-DC converters and the bus 106 may carry DC energy to a DC power distribution system and/or to a single centralized DC-AC inverter. The generated DC power may additionally or alternatively be supplied directly to commercial and/or residential systems via the load center 108, as well as stored for later use (for example, the generated energy may be stored utilizing batteries, heated water, hydro pumping, $H_2O$-to-hydrogen conversion, or the like).

In one or more alternative embodiments, the mounting brackets 150 retain other types of electronic devices, such as LED drivers, DC optimizers, rapid shutdown devices, monitoring devices, other safety related devices or the like.

Figure 2:
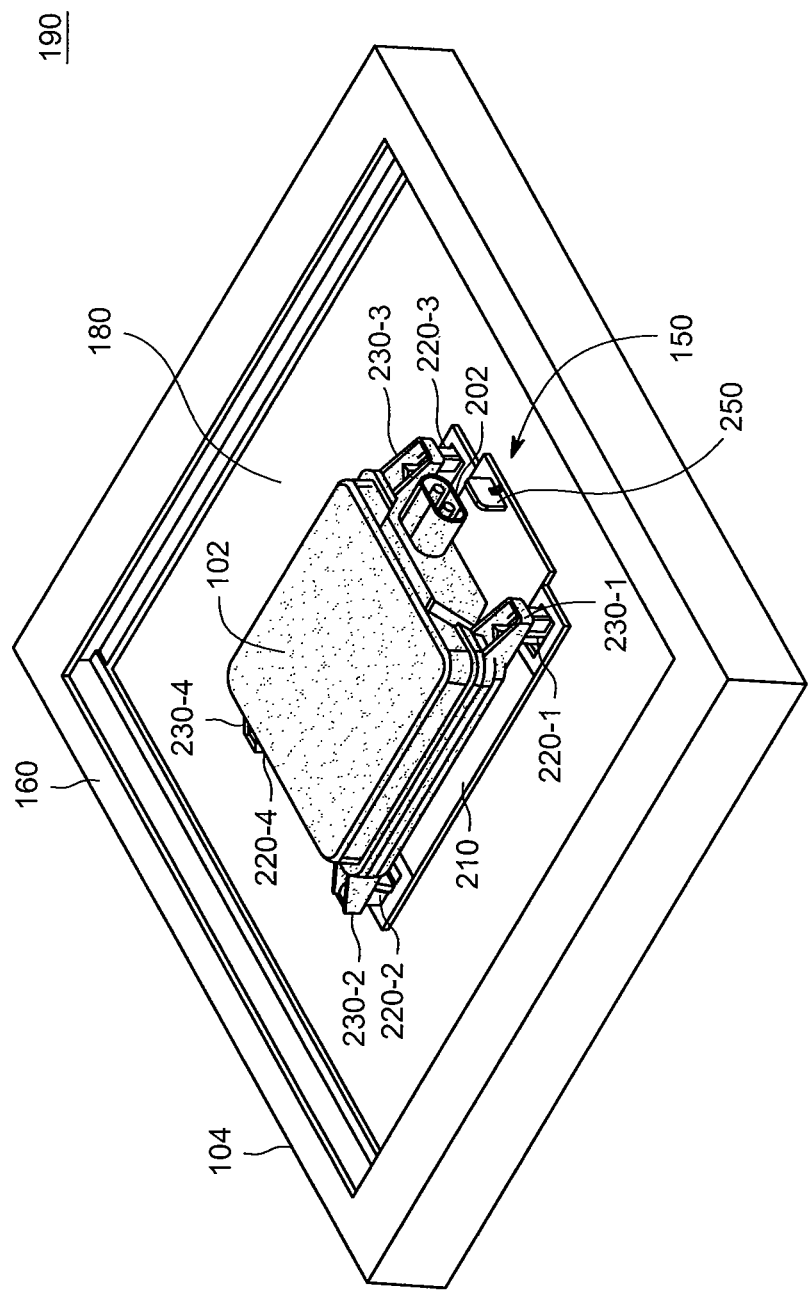
FIG. 2 is a top angled perspective view of a power module assembly in accordance with one or more embodiments of the present invention.

FIG. 2 is a top angled perspective view of a power module assembly 190 in accordance with one or more embodiments of the present invention. As previously described, the power module assembly 190 comprises the electronic device 102 mechanically coupled to the PV module 104 via the mounting bracket 150.

The mounting bracket 150 comprises a base member 210 generally shaped as a U-shaped rectangle and sized such that the outer edges of the base member 210 extend slightly beyond the perimeter of the electronic device 102. The base member 210 is formed from a non-electrically conductive (i.e., insulating) material, such as polycarbonate (PC), p-phenylene oxide (PPO™)+polystyrene (PS), p-phenylene ether (PPE), NORYL™, LEXAN™, or the like, and is adhered to the backsheet 180 of the PV module 104 by a suitable adhesive. Although the mounting bracket 150 depicted in FIG. 2 is substantially U-shaped, in other embodiments the mounting bracket 150 may have a different shape, such as a hollow rectangular shape or the like.

The mounting bracket 150 further comprises a plurality of electronic device retention members 220-1, 220-2, 220-3, and 220-4, collectively referred to as electronic device retention members 220. The electronic device retention members 220-1, 220-2, 220-3, and 220-4 (collectively referred to as electronic device retention members 220, or simply retention members 220) are positioned at the corners of the base member 210 and extend perpendicular from the base member 210 to mate with corresponding receptacles 230-1, 230-2, 230-3, and 230-4 of the electronic device 102 in order to retain the electronic device 102, as described in detail further below with respect to FIGS. 4-6. The electronic device retention members 220-1, 220-2, 220-3, and 220-4 are herein collectively referred to as electronic device retention members 220, or simply retention members 220. The receptacles 230-1, 230-2, 230-3, and 230-4 are herein collectively referred to as receptacles 230.

The mounting bracket 150 further comprises an obstruction 250 disposed on the base member 210 such that an output connector 202 of the electronic device 102 is blocked in order to prevent operation of the electronic device 102 while in the retracted position. The obstruction 250 extends perpendicular to the base member 210 and is sized and shaped to physically obstruct the output connector 202 while the electronic device 102 is in the retracted position. When the electronic device 102 is in the extended position, the output connector 202 is no longer obstructed by the obstruction 250 and a suitable power cable can be connected to the output connector 202.

When disposed in the retracted position, the electronic device 102 is pressed flat to the PV module backsheet 180 such that the electronic device 102 is not proud of the PV module frame 160. Such positioning allows the power module assembly 190 to be easily moved and/or stacked, for example in shipping, if laid on the ground or racking, and the like. The electronic device 102 may be moved from the retracted position to the extended position by pulling the electronic device 102 upwards to snap-lock into the extended position. The electronic device 102 is then maintained in the second position such that an air gap exists between the electronic device 102 and the PV module backsheet 180 for improved thermal management of the electronic device 102 and PV module backsheet 180. The air gap is generally on the order of 8-25 mm, for example it may be approximately 8-10 mm, although in other embodiments it may be larger or smaller.

The mounting bracket 150 enables the electronic device 102 to be removably mounted to the PV module 104 with very tight lateral clearances to the PV module frame 160 and racking, in contrast to a sliding rail system which requires almost twice the footprint when inserting and removing the electronic device 102 from the rails due to the required travel down the rails.

Figure 3:
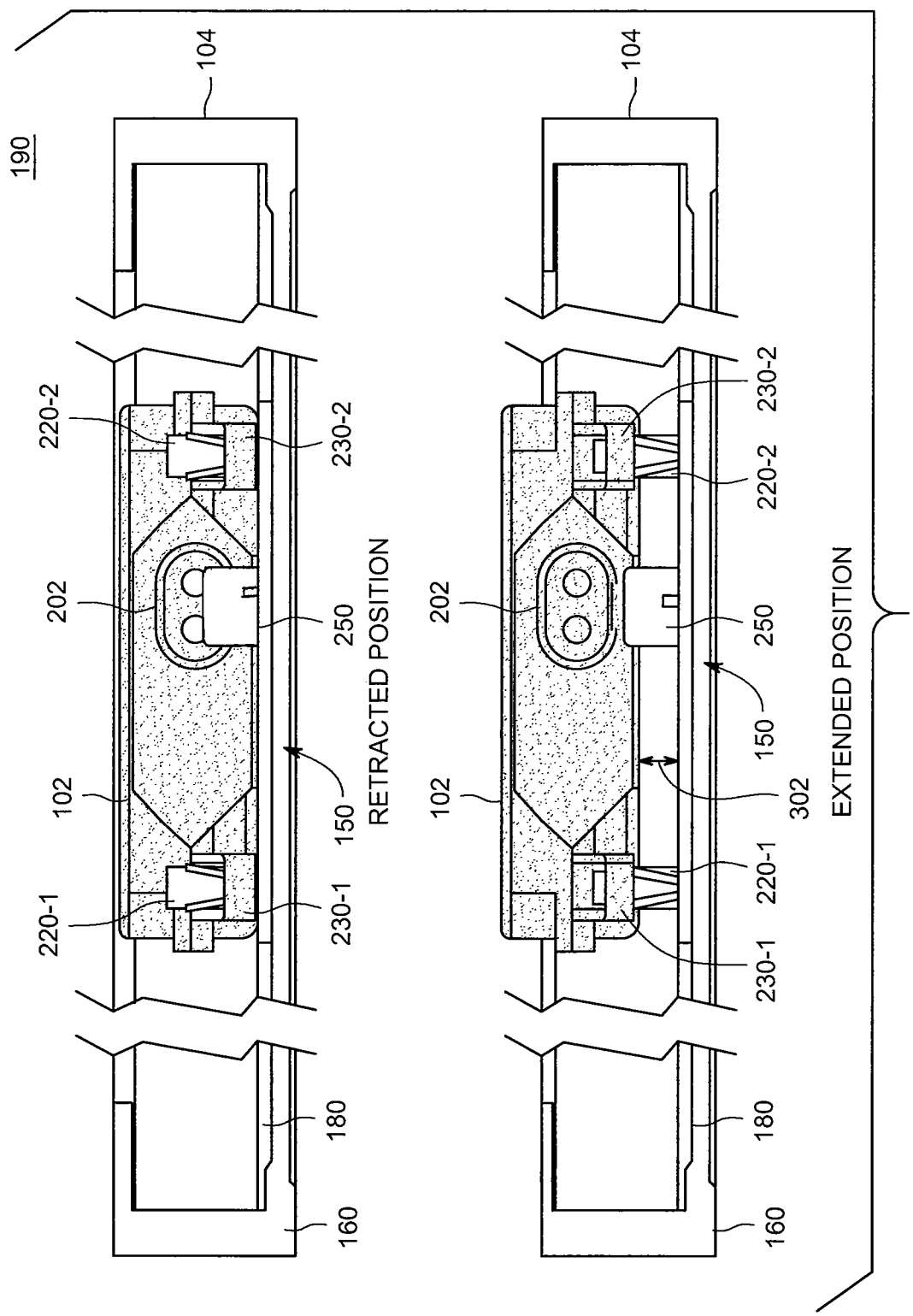
FIG. 3 is a is a multi-view drawing showing a front view of a power module assembly with a power electronic device in a retracted position and a front view of a power module assembly with a power electronic device in an extended position in accordance with one or more embodiments of the present invention.

FIG. 3 is a is a multi-view drawing showing a front view of a power module assembly 190 with an electronic device 102 in a retracted position and a front view of a power module assembly 190 with an electronic device 102 in an extended position in accordance with one or more embodiments of the present invention.

In the retracted position, the mounting bracket 150 the electronic device 102 pressed flat to the PV module backsheet 180. While in the retracted position, the output connector 202 of the electronic device 102 is blocked from access by the obstruction 250 which protrudes from the base member 210. In other embodiments, the mounting bracket 150 may have one or more other obstructions which block access to other features of the electronic device 102, such as other plugs or connectors.

In the extended position, the mounting bracket 150 retains the corresponding electronic device 102 proximate the corresponding PV module backsheet 180 with a defined gap 302 between the electronic device 102 and the PV module backsheet 180 that allows airflow between the components for thermal management of the electronic device 102 and the PV module 104. In some embodiments, the gap 302 may be on the order of 10-25 mm and may depend on topology features of the electronic device enclosure; for example, in certain embodiments the gap 302 may be on the order of 15 mm and other regions may be recessed by another 10 mm.

Figure 4:
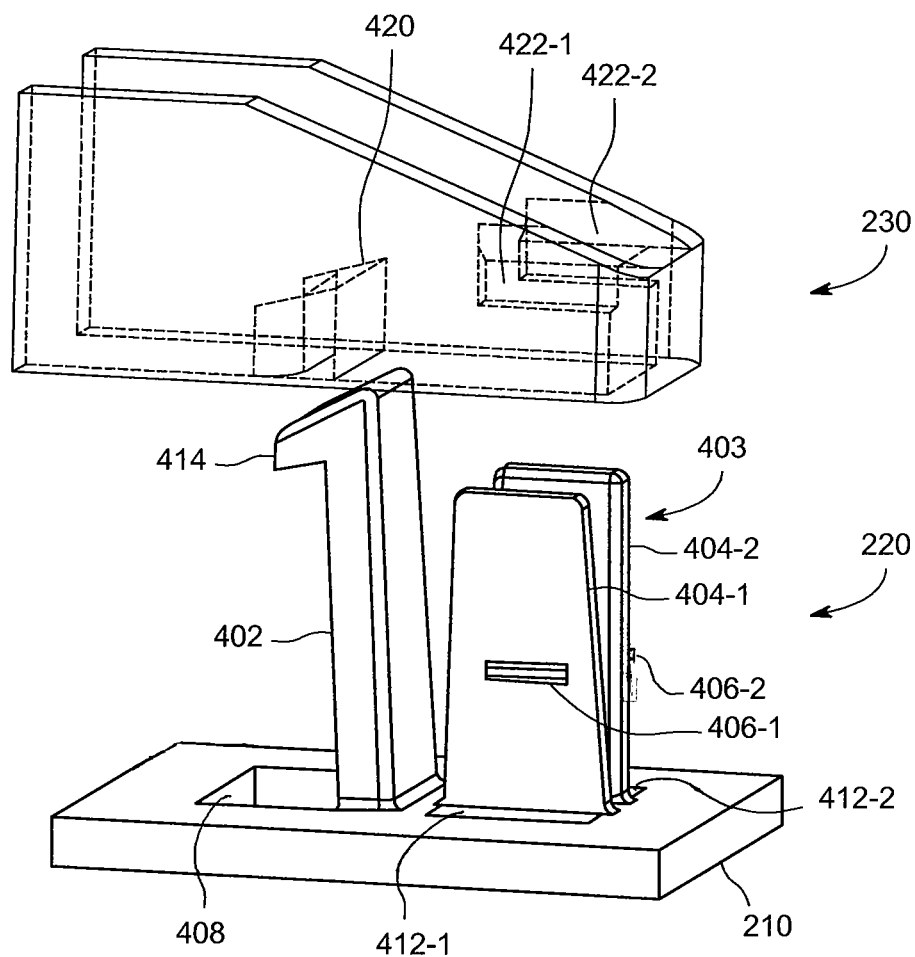
FIG. 4 is a side angled perspective view of a retention member and a receptacle in accordance with one or more embodiments of the present invention.

FIG. 4 is a side angled perspective view of a retention member 220 and a receptacle 230 in accordance with one or more embodiments of the present invention. The interface 230 is aligned with the retention member 220 such that it can be pushed down to mechanically couple to the retention member 220. The receptacle 230 is depicted in FIG. 4 as transparent in order to more clearly show features of the component.

The retention member 220 comprises a retaining latch 402 extending from the base member 210 and terminating in a hook 414. The retaining latch 402 extends vertically from the base member 210 and, when no force is applied to the retaining latch 402, is tilted at an angle slightly less than 90° with respect to the base member 210, although in other embodiments the retaining latch 402 may be perpendicular to the base member 210. The retention member 220 further comprises a bi-stable latch 403 comprising bi-stable latch arms 404-1 and 404-2, collectively referred to as bi-stable latch arms 404. The bi-stable latch arms 404 are trapezoidal shaped plates having a wide base and narrower top; although the narrow tip and wide base are not necessary, such a shape avails itself to the injection molding manufacturing process and simplifies assembly alignment. The bi-stable latch arms 404 are positioned on the base member 210 with the length of their bases parallel to one another and extend upwards and away from one another to form a substantially "V"-shape positioned in line with the retaining latch 402.

In some embodiments, one or both of the bi-stable latch arms 404 comprises one or more small raised features, or protuberances, at locations that serve as retraction friction locks; for example, retraction friction locks 406-1 and 406-2 are depicted in FIG. 4 approximately in the middle of the respective bi-stable latch arms 404-1 and 406-2 on their outward-facing sides.

The receptacle 230 is sized and shaped such that the retaining latch 402 and the bi-stable latch 403 can be inserted within it to couple the electronic device 102 to the mounting bracket 150. The receptacle 230 comprises a retaining stop 420, disposed between its interior walls, suitably sized and shaped to engage the retaining latch 402 for locking the electronic device 102 in the extended position as described in detail below with respect to FIG. 5. The receptacle 230 further comprises one or more bi-stable stops 422 disposed on its interior walls. The bi-stable stops 422 are suitably sized and shaped such that, in a first position, the bi-stable latch 403 engages the bi-stable stops 422 to lock the electronic device 102 in the retracted position and, in a second position, the bi-stable latch 403 engages the bi-stable stops 422 to lock the electronic device 102 in the extended position, as described in detail below with respect to FIG. 5. In the embodiment depicted in FIG. 4, the receptacle 230 comprises bi-stable stops 422-1 and 422-2 disposed on its opposing interior walls, and the bi-stable latch 403 comprises corresponding retraction friction locks 406-1 and 406-2 (e.g., protuberances) disposed on the outer-facing sides of the bi-stable latch arms 404-1 and 404-2, respectively. When the electronic device 102 is in the retracted position, the retraction friction locks 406-1 and 406-2 engage the tops of the bi-stable stops 422-1 and 422-2, respectively, to lock the electronic device 102 in the retracted position. When the electronic device 102 is in the extended position, the tops of the bi-stable latch arms 404-1 and 404-2, respectively, engage the bottoms of the corresponding bi-stable stops 422-1 and 422-2 to lock the electronic device 102 in the extended position.

Additionally, the retention member 220 defines a mold undercut window 408 at the inside-facing base of the retaining latch 402, as well as mold undercut windows 412-1 and 412-2 at the outward-facing bases of the bi-stables latch arms 404-1 and 404-2, respectively.

Figure 5:
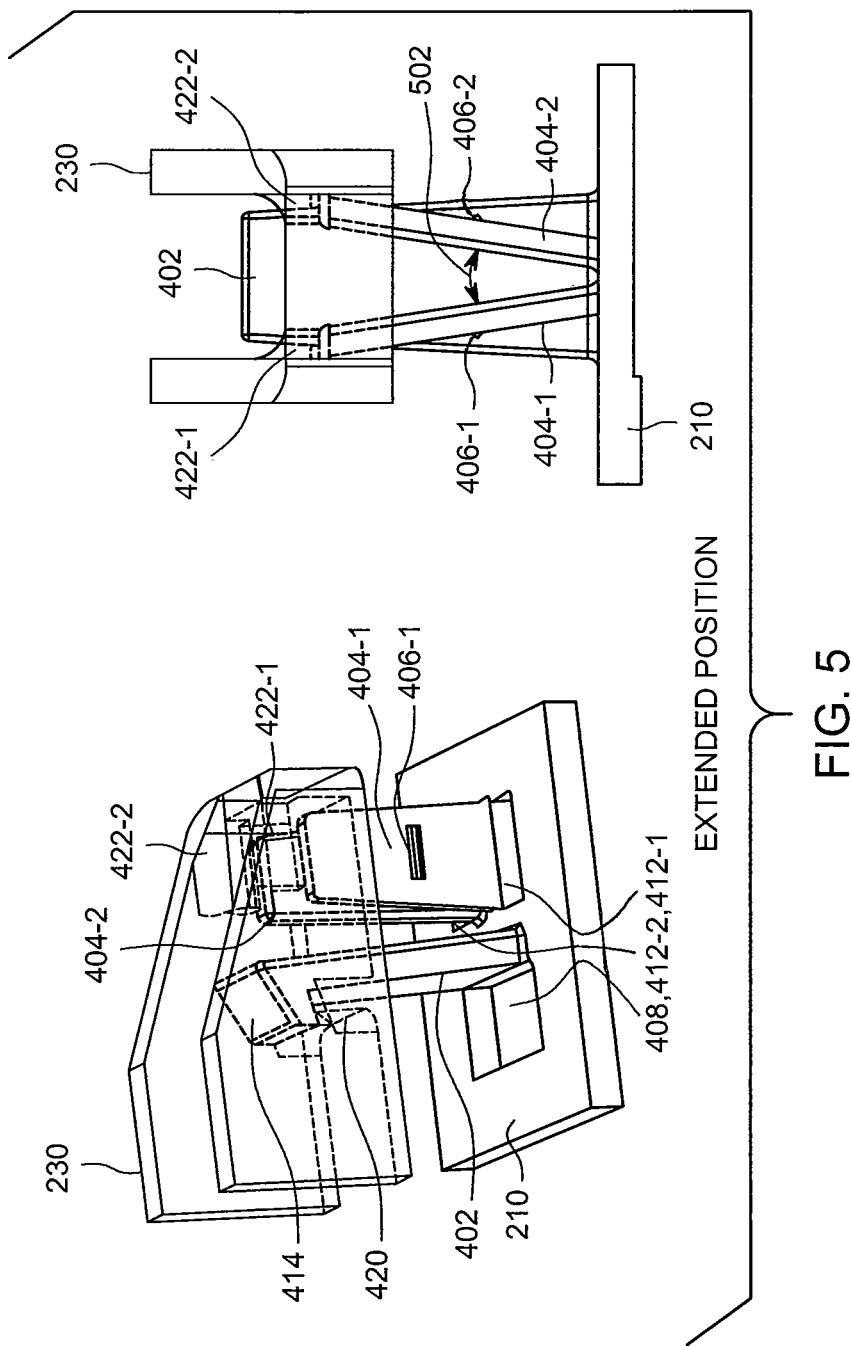
FIG. 5 is a multi-view drawing showing a front angled perspective view and a side view of a retention member engaging a receptacle in an extended position in accordance with one or more embodiments of the present invention.

FIG. 5 is a multi-view drawing showing a front angled perspective view and a side view of a retention member 220 engaging a receptacle 230 in an extended position in accordance with one or more embodiments of the present invention.

The first step in engaging the receptacle 230/retention member 220 and initially loading the electronic device 102 into the base member 210 is to snap the receptacle 230 over the retaining latch 402 by aligning the retaining stop 420 with the hook 414 and pushing downward on the receptacle 230 with sufficient force to deflect the retaining latch 402 and hook 414 away from the retaining stop 420. As the receptacle 230 slides over the top of the retaining hook 414, it comes to rest on tops of the bi-stable latch arms 404-1, 404-2 as they engage with the bi-stable stops 422-1, 422-2, respectively. As soon as the receptacle 230 lowers enough for the retaining hook 414 to snap back over the retaining stop 420, the receptacle 230 is trapped in the extended position by the engagement of the bi-stable latch arms 404 with the bi-stable stops 422 preventing further lowering and the retaining hook 414 preventing the receptacle 230 from being lifted up and out of the base member 210, as shown in FIG. 5. With no force applied to the bi-stable latch arms 404 as shown in FIG. 4, the inner angle (or retraction angle) 502 between the bi-stable latch arms 404 is sufficiently large such that the receptacle 230 cannot fit over the bi-stable latch arms 404.

Figure 6:
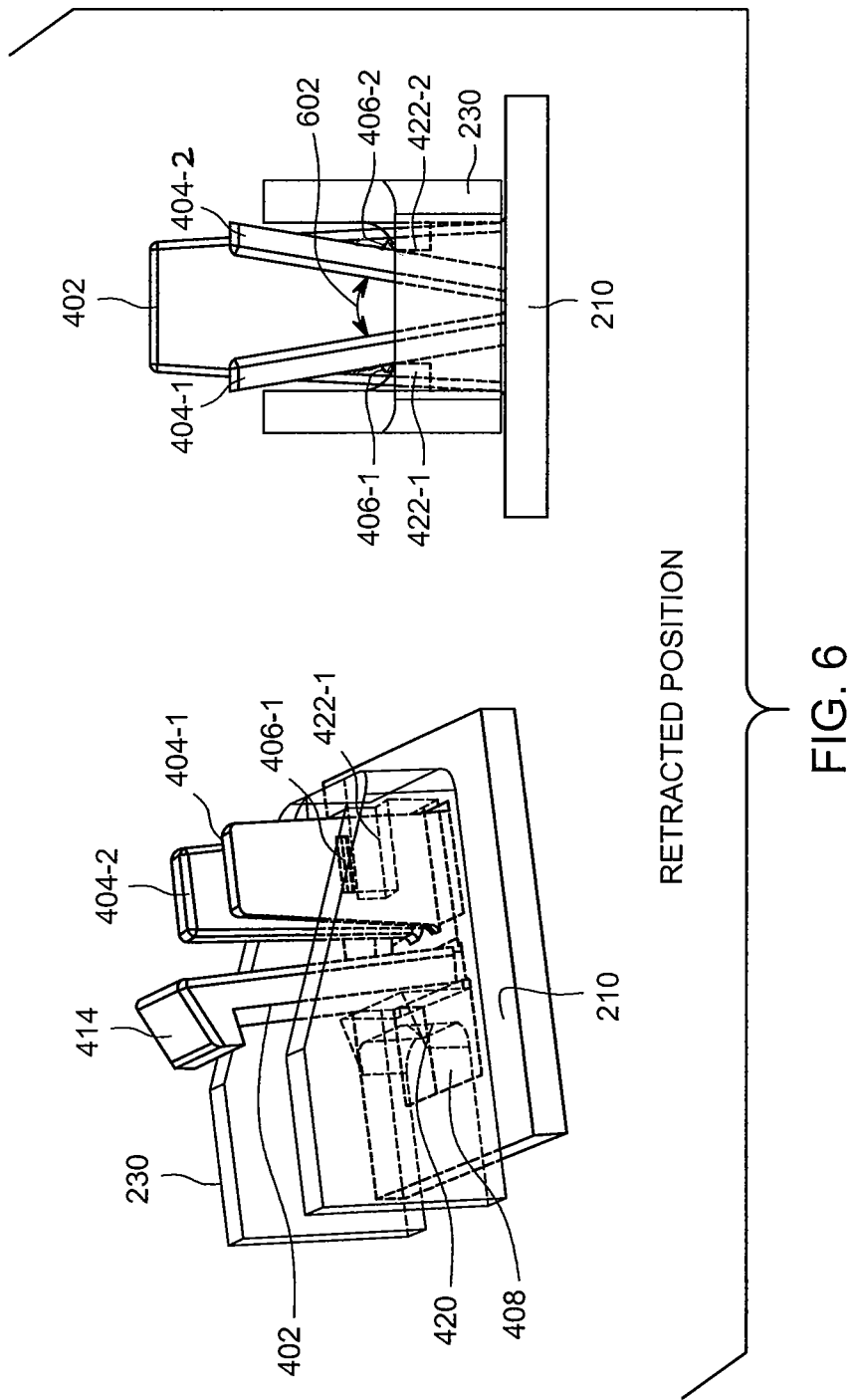
FIG. 6 is a multi-view drawing showing a side angled perspective view and a front view of a retention member engaging a receptacle in a retracted position in accordance with one or more embodiments of the present invention.

In order to lower the receptacle 230 to the retracted position, sufficient force must be applied to decrease the retraction angle 502 (i.e., to bring the bi-stable latch arms 404 sufficiently together) such that the receptacle 230 can be slid over the bi-stable latch arms 404. The receptacle 230 can then be lowered until the receptacle 230 rests on the upper surface of the base member 210 and the bi-stable latch arms 404 have an angle 602 between them as shown in FIG. 6; in some embodiments, the angle 602 may be less than the angle 502, while in other embodiments they may be substantially the same. The bi-stable latch arms 404 create a force that pulls the receptacle 230 toward the base member 210 and retains it at the top surface of the base member 210. The retraction force supplied by the bi-stable latch arms 404 along with the friction between the latch arms 404-1, 404-2 and the bi-stable stops 422-1, 422-2, respectively, defines the net force retaining the receptacle 230 in the lower position. In some embodiments, the bi-stable latch arms 404 may have an inner angle 502 on the order of 3-10 degrees while in the extended position; in other embodiments, the inner angle 502 may be on the order of 20 degrees.

In a factory type environment automated tools can be used to load the electronic device 102 into the mounting bracket 150 without first stopping at the extended position. This would be accomplished by a tool that has actuated pins extending up through the mold undercut windows 412-1, 412-2 in the base member 210. The actuated pins would deflect the bi-stable latch arms 404 to decrease the retraction angle 502 as described above to allow loading directly to the retracted position without stopping at the extended position.

Raising the receptacles 230 to the extended position is accomplished by applying a sufficiently large force to the receptacle 230 to overcome the retraction force. For example, an installer or field technician can do this by pulling the electronic device 102 away from the base member 210 by hand.

The extended position creates a larger air gap (for example ~8-10 mm) between the electronic device 102 and the PV module laminate (i.e., the PV module backsheet 180) which increases the thermal decoupling of the two heat sources and enhances convective cooling from the surfaces between the electronic device 102 and the PV module 104.

In order to lower or retract the receptacle 230, for example when in the field or in a factory, a force must be applied to the bi-stable latch arms 404 (for example, by hand or by a tool) to sufficiently decrease the retraction angle 502 (i.e., to bring the bi-stable latch arms 404 sufficiently together) so that the retraction friction locks 406 can slip between the bi-stable stops 422. In some embodiments, in order to prevent accidental repositioning of the electronic device 102 in use, a tool is required to move the electronic device 102 to the retracted position.

FIG. 6 is a multi-view drawing showing a side angled perspective view and a front view of a retention member 220 engaging a receptacle 230 in a retracted position in accordance with one or more embodiments of the present invention.

Once the receptacle 230 is lowered slightly below the extended position depicted in FIG. 5, the V-shaped configuration of the bi-stable latch 403 creates a retraction force on the receptacle 230 which pulls the receptacle 230 downward and retains it against the hard stop of the base member 210 as in FIG. 6. Additionally, the retraction friction locks 406 prevent the bi-stable stops 422 from moving upward without sufficient force being applied. This retraction force must be suitably large so as to prevent the electronic device 102 from lifting off the surface of the base member 210 as it experiences shocks and vibration, for example during handling and shipping conditions, yet not so large that an installer has difficulty pulling the electronic device 102 into the extended position during the final field installation process. The retraction force required is determined by the mass of the electronic device 102 and the acceleration forces expected during shipping and handling. For example, for a 1 kg electronic device 102, a retraction force of approximately 40-60N is desired.

The retraction force holding the receptacle 230 down can be increased in a number of ways. For example, the side profile of the bi-stable latch 402 can be modified from a V-shape to a U-shape to provide a non-linear retraction force as the receptacle 230 is lowered to the hard stop. Additionally or alternatively, the retraction angle 502 of the bi-stable latch 403 can be adjusted to increase the retraction force on the receptacle 230.

In order to return to the extended position depicted in FIG. 5, the electronic device 102 can be pulled upwards to snap-lock into the extended position.

Additional features in the latch and receptacle design also work together when an array of at least two mounts and receptacles are used at the perimeter of an electronic device enclosure 102. The retaining latch 402 centers the enclosure 102 between the multiple mounting points by pushing on the retaining stop wall over the entire range of motion. This self-centering feature also helps to make sure the bi-stable latch arms 404 are aligned with their corresponding mating bi-stable stops 422. The retaining latch 402 is also intentionally oriented in a direction primarily orthogonal to the bi-stable latch 403 in order to increase the strength of the system when loaded from any direction in the plane of the mount base member 210. When the electronic device 102 has an applied mechanical load in a direction normal to the surfaces of the bi-stable latch 403, the retaining latch 402 provides strength. When a mechanical load is applied normal to the retaining latch 402, the bi-stable latch 403 prevents the system from translating. Off-axis loads are distributed to both the set of retaining latches 402 and bi-stable latches 403.

Figure 7:
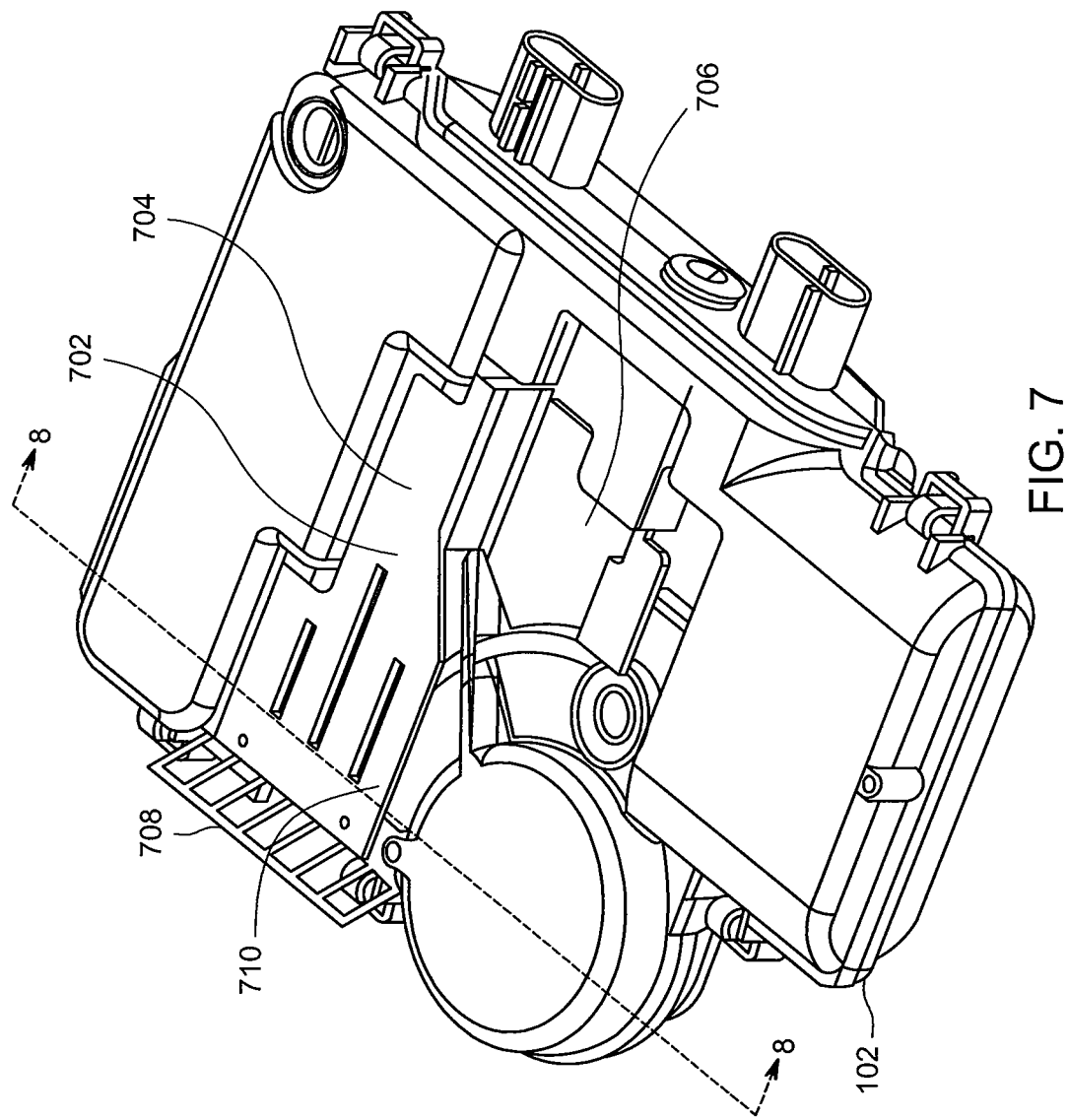
FIG. 7 is a bottom angled perspective view of an electronic device in accordance with one or more embodiments of the present invention.

FIG. 7 is a bottom angled perspective view of an electronic device 102 in accordance with one or more embodiments of the present invention. The view depicted in FIG. 7 shows the bottom surface of the electronic device 102 that faces the PV module backsheet 180 when the electronic device 102 is mounted on the mounting bracket 150.

The dual positions of the electronic device 102 (i.e., the retracted and extended positions) enables a two-position heat exchange system with enhanced performance in the extended position. With the electronic device 102 in the retracted position, a heat exchange surface 710 having a bonded region 706 (i.e., a portion bonded to the exterior of the electronic device 102) and a suspended region 704 (i.e., a portion suspended apart from the electronic device 102) that terminates in heat sink fins 702 (for example, stamped metal heat sink fins) are in close proximity with the PV module backsheet 180. With the electronic device 102 in the extended position, a larger, more symmetric air gap (shown in detail in FIG. 8) is created between the electronic device 102 and the PV module 104. The large air gap on both sides of the heat sink fins 702 while in the extended position nearly doubles the effective heat exchange surface area from both sides of the heat sink fin 702 rather than a single side.

The heat exchange surface 710, which has its bonded region 706 bonded to the electronic device external surface, has a reinforced or double insulation rating relative to the electronics internal to the electronic device enclosure which prevents the need for safety grounding of the exposed metal feature.

In some embodiments, the electronic device 102 further comprises a protective insulating grill 708 having a bi-stable position that prevents access to the heat sink fins 702 in both the extended and the retracted positons. The grill 708 is disposed on the rear side of the electronic device 102 such that it blocks access to the heat sink fins 702.

Figure 8:
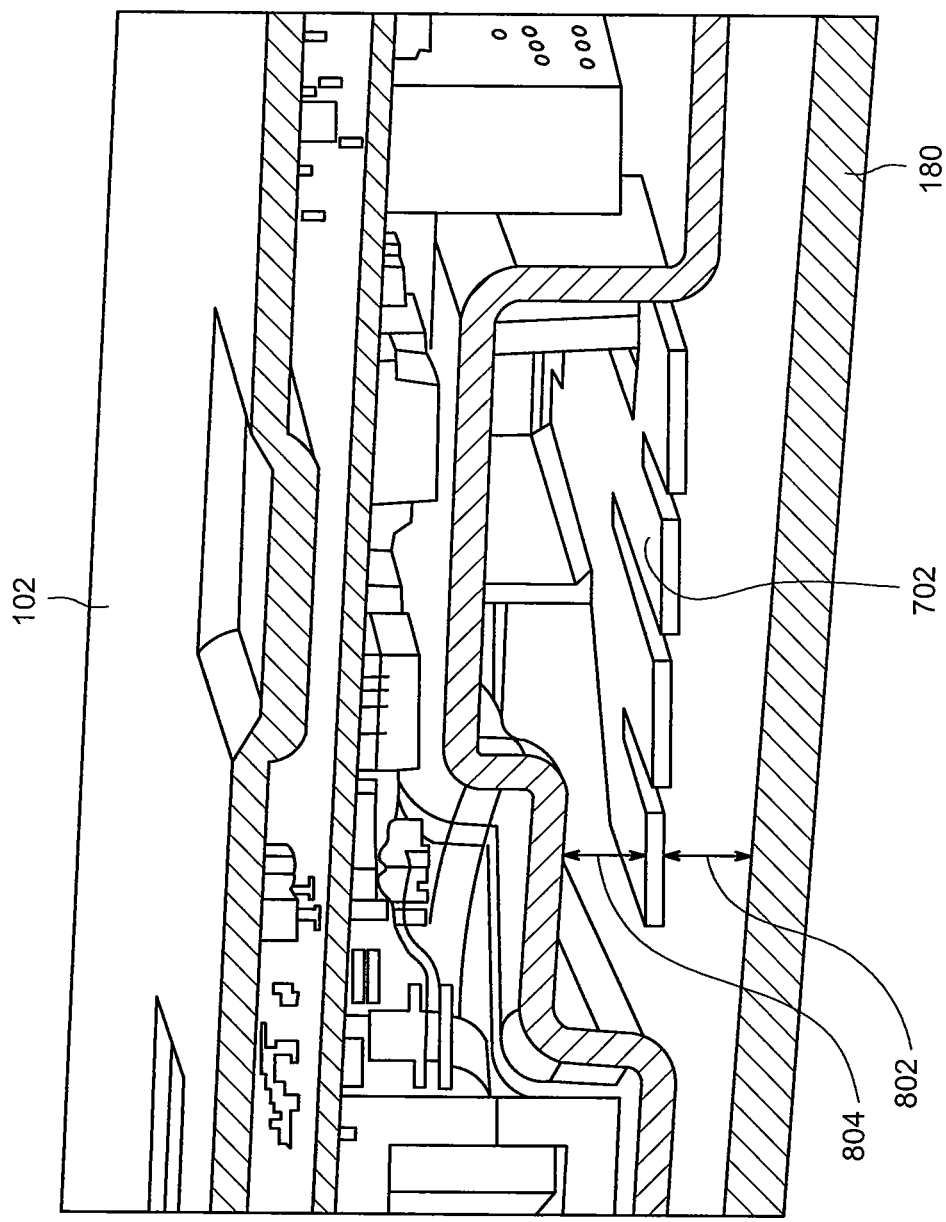
FIG. 8 is a cross-sectional view of an electronic device taken along line 8-8 of FIG. 7 in accordance with one or more embodiments of the present invention.

FIG. 8 is a cross-sectional view of an electronic device 102 taken along line 8-8 of FIG. 7 in accordance with one or more embodiments of the present invention. In the cross-sectional view depicted in FIG. 8, the electronic device 102 is oriented with its bottom surface facing down.

The heat sink fin 702 is suspended between the PV module backsheet 180 such that a first air gap 802 is present between the heat sink fin 702 and the PV module backsheet 180, and a second air gap 804 is present between the heat sink fin 702 and the bottom surface of the electronic device 102. In some embodiments, the first air gap 802 is on the order of 15 mm when the electronic device 102 is in the extended position, and the second air gap 804 is on the order of 15 mm.

Figure 9:
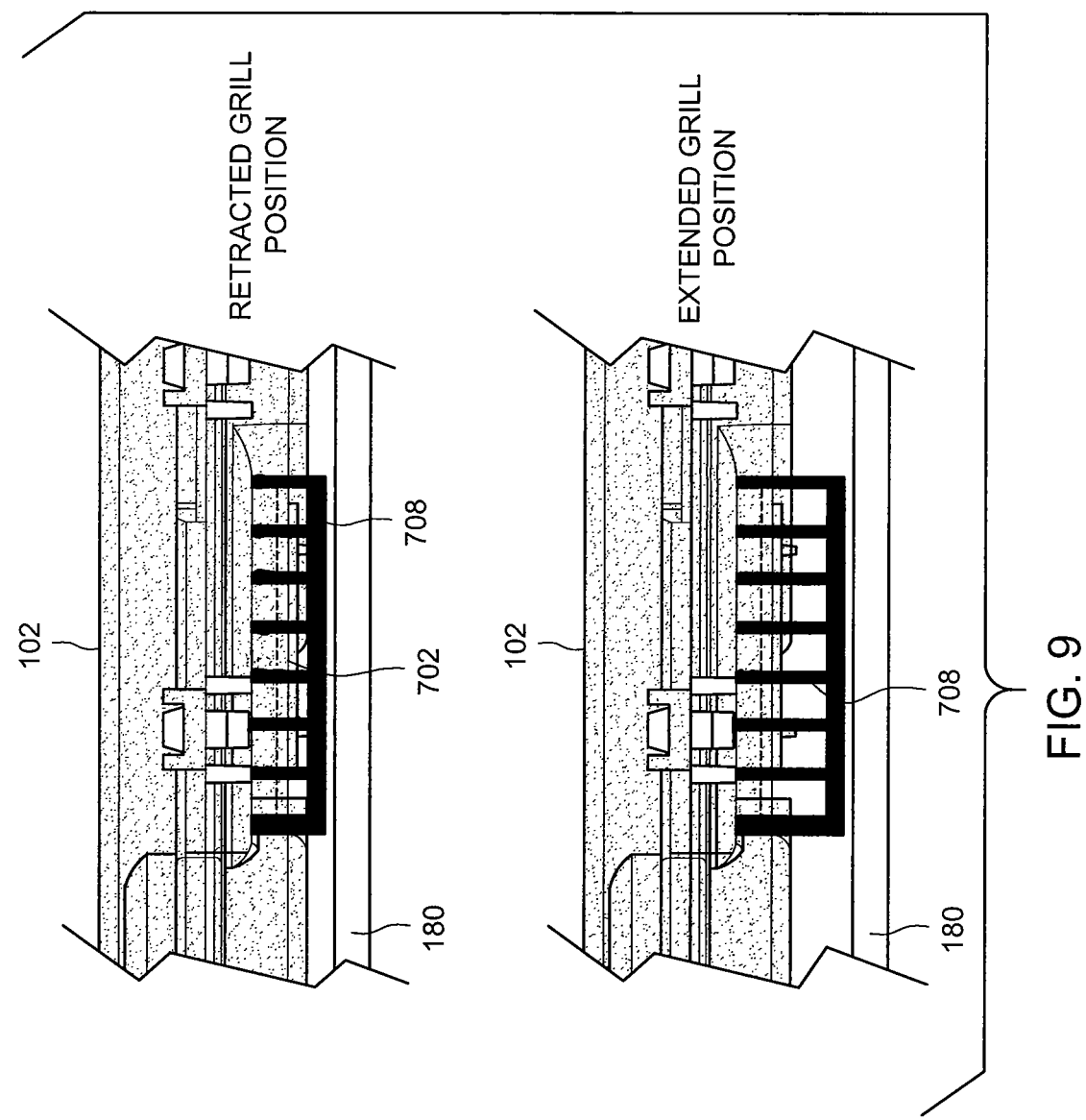
FIG. 9 is a multi-view drawing showing a rear view and a side angled perspective view of an electronic device comprising an insulating grill in accordance with one or more embodiments of the present invention.

FIG. 9 is a multi-view drawing showing a rear view and a side angled perspective view of an electronic device 102 comprising an insulating grill 708 in accordance with one or more embodiments of the present invention. As depicted in FIG. 9, the electronic device 102 is in a retracted position and the insulating grill 708 is in a first position such that it extends from the rear face of the electronic device 102 to the PV module backsheet 180 to block access to the heat sink fins 702. In some embodiments, the bottom of the insulating grill 708 rests against the PV module backsheet 180 when the insulating grill is in the first position. In one or more embodiments, the insulating grill 708 may have a curved shape such that it curves downward toward the PV module backsheet 180 and away from the electronic device 102.

Figure 10:
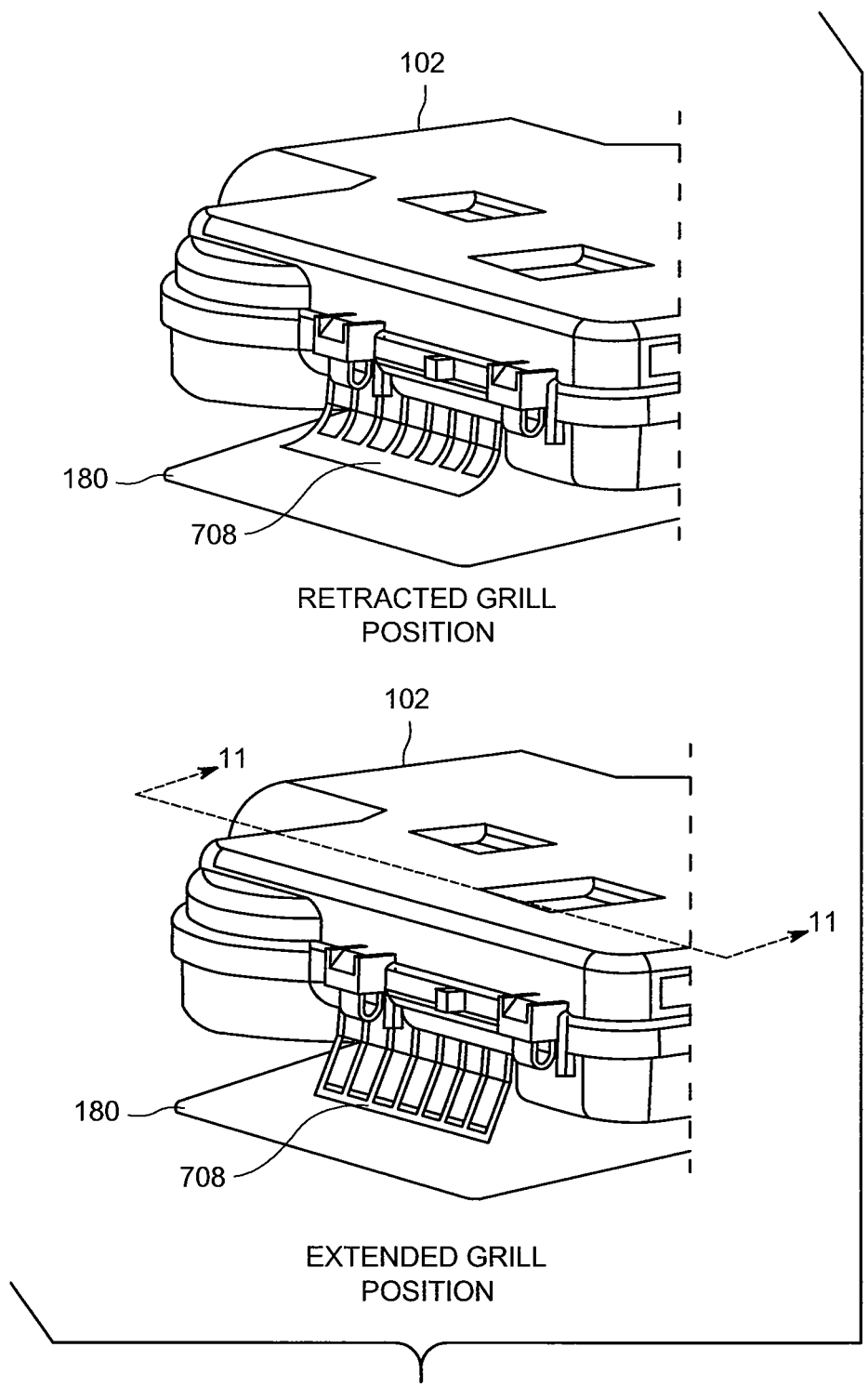
FIG. 10 is a multi-view drawing showing a rear view and a side angled perspective view of an electronic device comprising an insulating grill in accordance with one or more embodiments of the present invention.

FIG. 10 is a multi-view drawing showing a rear view and a side angled perspective view of an electronic device 102 comprising an insulating grill 708 in accordance with one or more embodiments of the present invention. As depicted in FIG. 10, the electronic device 102 is in an extended position and the insulating grill 708 is in a second position such that it extends downward from the rear face of the electronic device 102 to block access to the heat sink fins 702. Generally, when the electronic device 102 is in the extended position and the insulating grill 708 is in the second position, a small gap 1002 exists between the bottom of the insulating grill 708 and the PV module backsheet 180, although in some embodiments the gap 1002 may be greater or smaller and in some alternative embodiments the bottom of the insulating grill 708 is in contact with the PV module backsheet 180 while the insulating grill 708 is in the second position.

The insulating grill 708 is movably coupled to the electronic device 102 such that when the electronic device 102 is moved from the retracted to the extended position the insulating grill 708 moves from the first position to the second position, and when the electronic device 102 is moved from the extended to the retracted position the insulating grill 708 moves from the second position to the first position.

Figure 11:
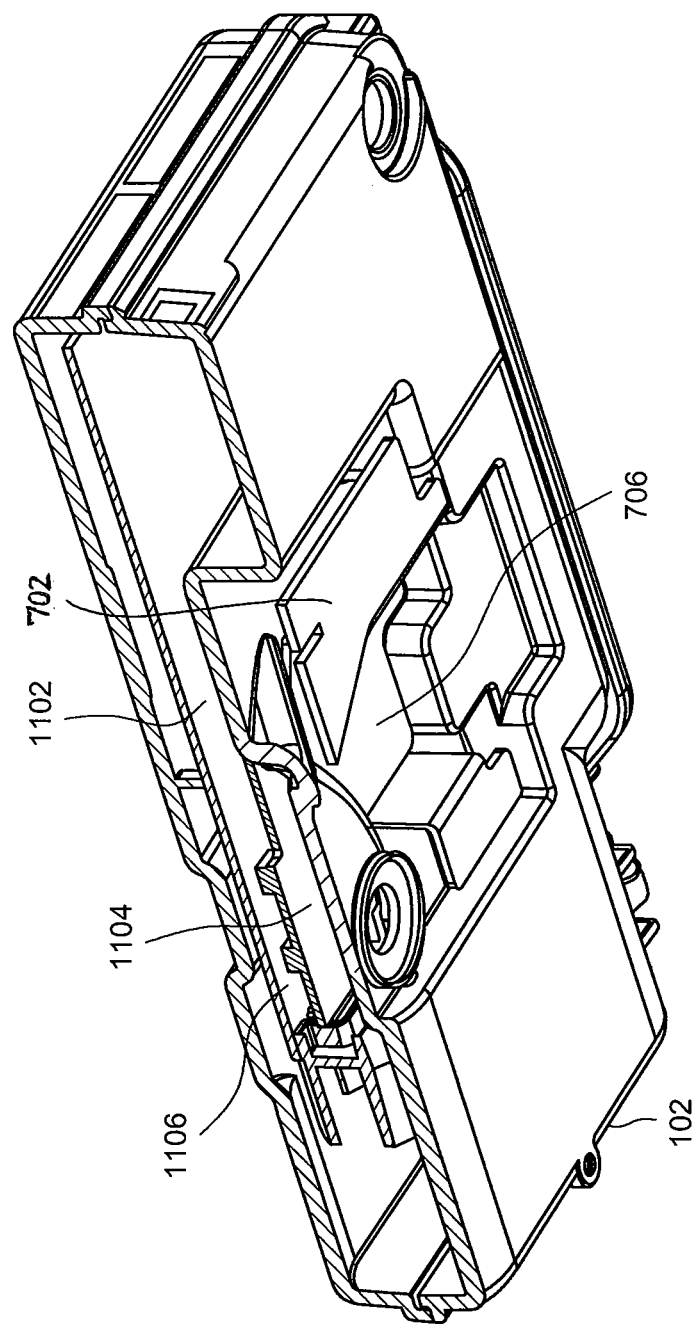
FIG. 11 is a multi-view drawing showing a rear view and a side angled perspective view of an electronic device comprising an insulating grill in accordance with one or more embodiments of the present invention.

FIG. 11 is a cross-sectional view of an electronic device 102 taken along line 11-11 of FIG. 10 in accordance with one or more embodiments of the present invention. In the cross-sectional view depicted in FIG. 8, the electronic device 102 is oriented with its bottom surface (i.e., its surface that faces the PV module backsheet 180) facing down.

In some embodiments, such as the embodiments described herein, the electronic device 102 has an insulating plastic enclosure. The electronic device 102 comprises within its enclosure a printed circuit board (PCB) assembly 1102 and an internal heat spreader 1104. The external heat sink fin 702 is bonded to a first surface area of the insulating plastic enclosure at the bonded region 706 that has the internal heat spreader 1104 bonded to the opposing surface of the first surface area so as to transfer heat across the insulating interface with a small temperature gradient. The internal heat spreader 1104 has a second surface area coupled to a primary heat source on the PCB assembly 1102 such as a transistor or other heat dissipating device.

In some embodiments, the invention or parts of the invention described herein may be combined with or represent another embodiment of a double insulated heat spreader (such as the double insulated heat spreader found in co-pending, commonly assigned U.S. patent application Ser. No. 14/591,355, entitled "Double Insulated Heated Spreader" and filed Jan. 7, 2015, which is herein incorporated by reference in its entirety) and/or an electrical/thermo-mechanical interconnection system (such as the electrical/thermo-mechanical interconnection system found in co-pending, commonly assigned U.S. patent application Ser. No. 14/793,164, entitled "Apparatus and System for Coupling Power Electronics to a Photovoltaic Module" and filed Jul. 7, 2015, which is herein incorporated by reference in its entirety).

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is determined by the claims that follow.

The invention claimed is:

1. An apparatus for mounting a power electronic device to a photovoltaic (PV) module, comprising:
   a mounting bracket that mechanically couples the power electronic device to a backsheet of the PV module such that positioning of the power electronic device can be dynamically interchanged between a retracted position in which the power electronic device is pressed flat to the backsheet, and an extended position in which the power electronic device is coupled to the backsheet with an air gap between the power electronic device and the backsheet,
   wherein the mounting bracket comprises a plurality of bi-stable latches disposed on a base member that is adhered to the backsheet; and wherein each bi-stable latch of the plurality of bi-stable latches mates with a corresponding receptacle of the power electronic device and engages with at least one corresponding bi-stable stop of the corresponding receptacle (i) in a first position that maintains the power electronic device in the retracted position and (ii) in a second position that maintains the power electronic device in the extended position.

2. The apparatus of claim 1, wherein each bi-stable latch comprises two arms having an inner angle between them, and wherein the at least one corresponding bi-stable stop comprises two bi-stable stops, and wherein when the two arms are engaged with the two bi-stable stops in the second position and no force is applied to the two arms, the inner angle is such that the two bi-stable stops prevent the receptacle from being lowered over the two arms.

3. The apparatus of claim 2, wherein in order to lower the receptacle over the two arms, force must be applied to bring the two arms closer together such that the two arms no longer engage with the two bi-stable stops.

4. The apparatus of claim 3, wherein when the power electronic device is the retracted position, the two arms create a retraction force against the two bi-stable stops that pulls the receptacle toward the base member.

5. The apparatus of claim 4, wherein each arm of the two arms comprises a retraction friction lock disposed on its outer-facing side; and wherein when the power electronic device is in the retracted position, each retraction friction lock engages one of the two bi-stable stops such that the retraction force along with the friction between the two arms and the two bi-stable stops defines the net force retaining the receptacle.

6. The apparatus of claim 1, wherein the mounting bracket further comprises a plurality of retaining latches, each retaining latch of the plurality of retaining latches disposed proximate to a corresponding bi-stable latch of the plurality of bi-stable latches; and wherein when the power electronic device is in the extended position, each retaining latch of the plurality of retaining latches engages with a corresponding retaining stop of the receptacle to lock the power electronic device in the extended position.

7. The apparatus of claim 1, wherein the mounting bracket comprises a base member adhered to the backsheet and an obstruction disposed on the base member such that an output connector of the power electronic device is physically blocked while the power electronic device is in the retracted position.

8. The apparatus of claim 1, wherein the power electronic module is moved between the retracted position and the extended position by manually applying force to the power electronic module.

9. The apparatus of claim 1, wherein when the power electronic module is in the retracted position, the power electronic module is recessed below an outer profile of a frame of the PV module.

10. A power module assembly comprising:
   a photovoltaic (PV) module;
   a power electronic device; and
   a mounting bracket that mechanically couples the power electronic device to a backsheet of the PV module such that positioning of the power electronic device can be dynamically interchanged between a retracted position in which the power electronic device is pressed flat to the backsheet, and an extended position in which the power electronic device is coupled to the backsheet with an air gap between the power electronic device and the backsheet,
   wherein the mounting bracket comprises a plurality of bi-stable latches disposed on a base member that is adhered to the backsheet; and wherein each bi-stable latch of the plurality of bi-stable latches mates with a corresponding receptacle of the power electronic device and engages with at least one corresponding bi-stable stop of the corresponding receptacle (i) in a first position that maintains the power electronic device in the retracted position and (ii) in a second position that maintains the power electronic device in the extended position.

11. The power module assembly of claim 10, wherein each bi-stable latch comprises two arms having an inner angle between them, and wherein the at least one corresponding bi-stable stop comprises two bi-stable stops, and wherein when the two arms are engaged with the two bi-stable stops in the second position and no force is applied to the two arms, the inner angle is such that the two bi-stable stops prevent the receptacle from being lowered over the two arms.

12. The power module assembly of claim 11, wherein in order to lower the receptacle over the two arms, force must be applied to bring the two arms closer together such that the two arms no longer engage with the two bi-stable stops.

13. The power module assembly of claim 12, wherein when the power electronic device is the retracted position, the two arms create a retraction force against the two bi-stable stops that pulls the receptacle toward the base member.

14. The power module assembly of claim 13, wherein each arm of the two arms comprises a retraction friction lock disposed on its outer-facing side; and wherein when the power electronic device is in the retracted position, each retraction friction lock engages one of the two bi-stable stops such that the retraction force along with the friction between the two arms and the two bi-stable stops defines the net force retaining the receptacle.

15. The power module assembly of claim 10, wherein the mounting bracket further comprises a plurality of retaining latches, each retaining latch of the plurality of retaining latches disposed proximate to a corresponding bi-stable latch of the plurality of bi-stable latches; and wherein when the power electronic device is in the extended position, each retaining latch of the plurality of retaining latches engages with a corresponding retaining stop of the receptacle to lock the power electronic device in the extended position.

16. The power module assembly of claim 10, wherein the mounting bracket comprises a base member adhered to the backsheet and an obstruction disposed on the base member such that an output connector of the power electronic device is physically blocked while the power electronic device is in the retracted position.

17. The power module assembly of claim 10, wherein the power electronic module is removably coupled to the mounting bracket.

18. The power module assembly of claim 10, wherein when the power electronic module is moved between the retracted position and the extended position by manually applying force to the power electronic module.

* * * * *